United States Patent
Kim et al.

(10) Patent No.: US 7,835,204 B2
(45) Date of Patent: Nov. 16, 2010

(54) SEMICONDUCTOR MEMORY DEVICE FOR GENERATING COLUMN ADDRESS

(75) Inventors: Kyung-Whan Kim, Kyoungki-Do (KR); Eun-Young Park, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 121 days.

(21) Appl. No.: 12/165,030

(22) Filed: Jun. 30, 2008

(65) Prior Publication Data
US 2009/0168567 A1 Jul. 2, 2009

(30) Foreign Application Priority Data
Dec. 26, 2007 (KR) .................. 10-2007-0137428

(51) Int. Cl.
*G11C 7/00* (2006.01)
(52) U.S. Cl. .................. 365/194; 365/193; 365/230.06; 365/189.05
(58) Field of Classification Search .................. 365/194, 365/193, 230.06, 189.05
See application file for complete search history.

(56) References Cited

U.S. PATENT DOCUMENTS

| | | | | | |
|---|---|---|---|---|---|
| 5,493,241 | A | * | 2/1996 | Landry et al. | 326/105 |
| 6,982,923 | B2 | * | 1/2006 | Ootsuki | 365/189.15 |
| 7,248,512 | B2 | * | 7/2007 | Shin | 365/194 |
| 7,397,727 | B2 | * | 7/2008 | Schnell et al. | 365/239 |
| 7,417,917 | B2 | * | 8/2008 | Lee et al. | 365/230.06 |

FOREIGN PATENT DOCUMENTS

KR 1020070002841 A 1/2007
KR 1020070073027 A 7/2007

* cited by examiner

*Primary Examiner*—Connie C Yoha
(74) *Attorney, Agent, or Firm*—IP & T Group LLP (57) ABSTRACT

A semiconductor memory device can ensure a sufficient margin between a column select signal and a column address signal when a delay time of the column select signal is increased to improve an address access time during a write operation. The semiconductor memory device includes a discrimination signal generating circuit configured to generate a discrimination signal activated in a write operation of the device, and a selective delay circuit configured to selectively delay a column address in response to the discrimination signal.

12 Claims, 6 Drawing Sheets

SEMICONDUCTOR MEMORY DEVICE FOR GENERATING COLUMN ADDRESS

CROSS-REFERENCE TO RELATED APPLICATION

The present invention claims priority of Korean patent application number 10-2007-0137428, filed on Dec. 26, 2007, which is incorporated by reference in its entirety.

BACKGROUND OF THE INVENTION

The present invention relates to a semiconductor memory device, and more particularly to a semiconductor memory device that can stably ensure a timing margin in generating a column select signal (YS).

Figure 1:
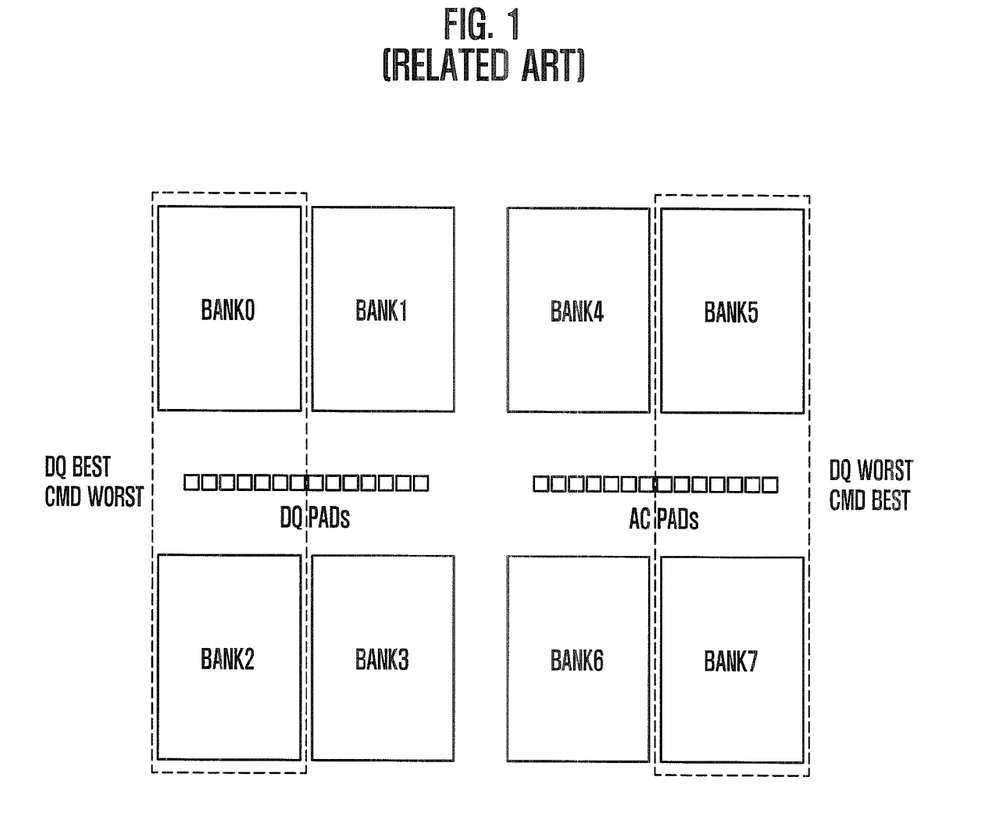
FIG. 1 is a block diagram of a conventional semiconductor memory device having eight banks.

FIG. 1 is a block diagram of a conventional semiconductor memory device having eight banks, BANK0, BANK1, BANK2, BANK3, BANK4, BANK5, BANK6 and BANK7.

With the recent development of semiconductor memory devices, having large capacity and high performance, e.g., DDR3 SDRAM, the semiconductor memory devices have changed in configuration from four banks to eight banks.

In a chip of such a semiconductor memory device, data input/output (I/O) pads are called DQ pads, and I/O pads for addresses and commands are called AC pads. Such AC pads and DQ pads are concentrated on specific locations of the chip, as illustrated in FIG. 1. Therefore, some banks are close to the DQ pads or AC pads but other banks are far from the DQ pads or AC pads.

In FIG. 1, for example, fifth and seventh banks BANK5 and BANK7, which are indicated by 'DQ WORST' and 'CMD BEST', are far from the DQ pads but close to the AC pads. Similarly, zeroth and first banks BANK0 and BANK1, which are indicated by 'DQ BEST' and 'CMD WORST', are close to the DQ pads but far from the AC pads. Herein, CMD is an abbreviation of command.

Figure 2:
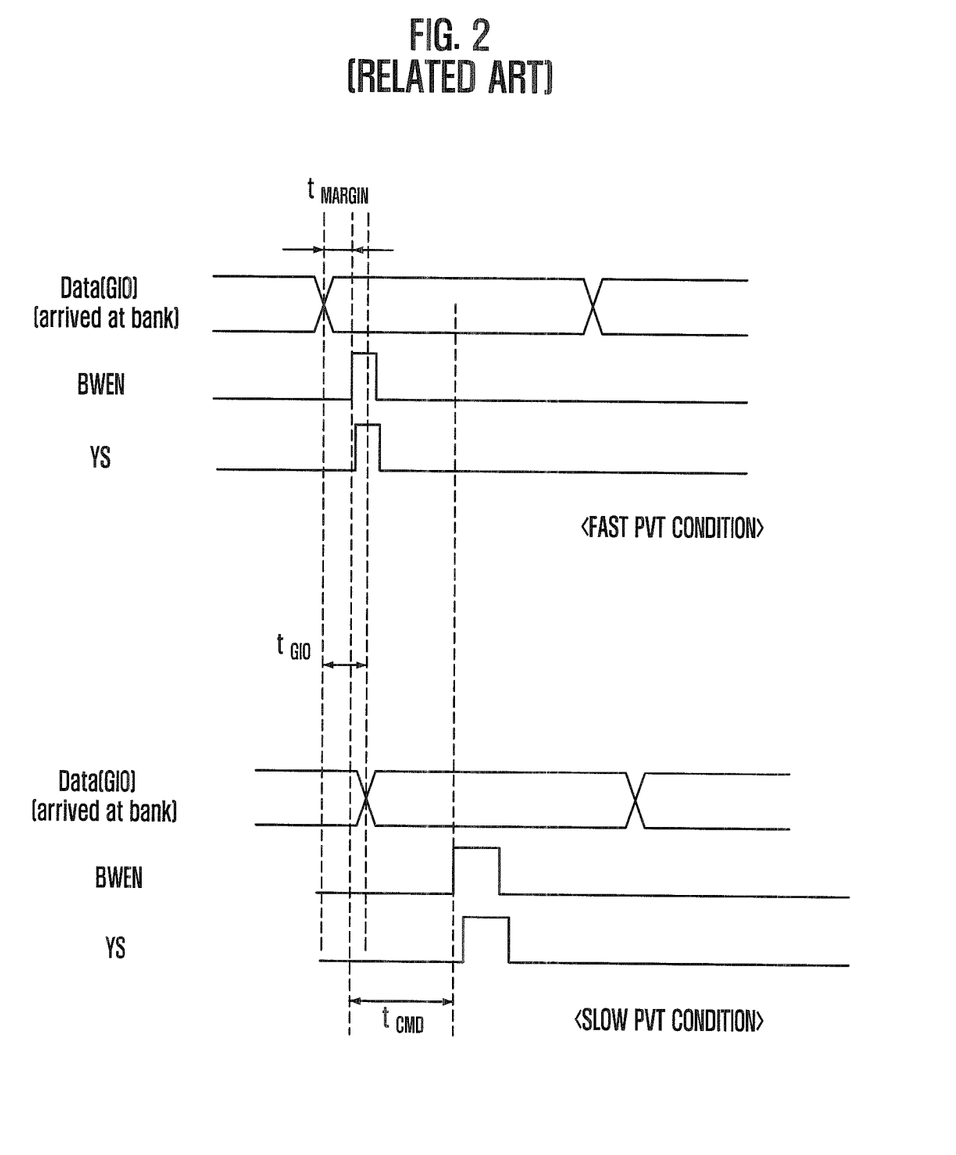
FIG. 2 is a timing diagram illustrating a write operation at a bank.

FIG. 2 is a timing diagram illustrating a write operation at a bank.

The timing diagram in an upper side of FIG. 2 illustrates timings of signals under a FAST PVT (process-voltage-temperature) condition at a bank of 'DQ WORST' and 'CMD BEST'. Herein, the FAST PVT condition represents a condition of a semiconductor memory device to operate with fast operating characteristics. That is, a voltage (V) is high and a temperature (T) is low, and a process (P) is performed to cause the fast operating characteristics. On the contrary, the timing diagram in a lower side of FIG. 2 illustrates timings of signals under a SLOW PVT condition at a bank of 'DQ BEST' and 'CMD WORST'.

Data to be written to the bank is transferred to the bank through the DQ pad, and the transferred data is then written to the bank in response to a bank write enable signal BWEN. A column select signal YS is selected by a column address. While the column select signal YS is activated, data is written to a memory cell of a selected column in the bank. The column select signal YS has only a slight time difference from the bank write enable signal BWEN so that the column select signal YS and the bank write enable signal BWEN are activated almost simultaneously. The column select signal YS is pushed or pulled as the bank write enable signal BWEN is.

As for data DATA(GIO), the number of logic devices through which the data DATA(GIO) passes must be minimized in order that the data DATA(GIO) arrive at the bank within a minimum delay time. The data DATA(GIO) mainly passes along a metal line until it arrives at the bank, which is called a global input/output (GIO) line. Because the GIO line has RC delay characteristics, the data DATA(GIO) experiences RC delays while being transferred through the GIO line. Accordingly, delay times of the data DATA(GIO) is not greatly changed under the SLOW PVT condition compared to the FAST PVT condition because the RC delay has little effect on a PVT variation. The GIO line is thus classified as a transmission line of data. In FIG. 2, a symbol '$t_{GIO}$' indicates an arriving time variation of a data signal at a bank caused by the PVT variation.

Meanwhile, since the bank write enable signal BWEN and the column select signal YS pass through a timing control circuit and other complex control circuits, they pass through a number of logic gates. Therefore, the bank write enable signal BWEN and the column select signal YS sensitively vary with the PVT variation, and thus these signals are classified as command signals. Referring to FIG. 2, it can be observed that $t_{CMD}$, which indicates a delay time variation of the command signal according to the PVT variation, is greater than the time variation $t_{GIO}$.

In order for the data to be written to the bank, the data must arrive at the bank earlier than commands, and an appropriate timing margin $t_{MARGIN}$ must be ensured. Under the FAST PVT condition, the command signals BWEN and YS sensitive to the PVT variation can be faster than the data signals DATA(GIO), so that it is difficult to ensure an appropriate timing margin $t_{MARGIN}$. For this reason, the command signals BWEN and YS are intentionally delayed.

In particular, it is indispensably necessary to delay the command signals BWEN and YS at the bank of 'DQ WORST' and 'CMD BEST' under the FAST PVT condition, as illustrated in the timing diagram in the upper side of FIG. 2.

The timing diagram at the lower side of FIG. 2 illustrates timings of signals under the SLOW PVT condition at the bank of 'DQ BEST' and 'CMD WORST'. Since the data signal DATA(GIO) arrives at the bank of 'DQ BEST' and is little affected by the PVT variation, the data signal DATA(GIO) can arrive at the bank relatively fast even under the SLOW PVT condition.

On the contrary, the command signals BWEN and YS are delayed more than the data signal DATA(GIO). This is because the condition is the 'CMD WORST' condition, and also delay amounts of the command signals BWEN and YS, which are intentionally set to ensure the appropriate timing margin $t_{MARGIN}$ under the FAST PVT condition, cause the column command signals BWEN and YS to be delayed much more under the SLOW PVT condition.

The column select signal YS is activated during a read operation as well as a write operation so that the data in the bank is transferred to the GIO line. However, an activation timing of the column select signal YS is intentionally delayed as described above, thus leading to an increase in an address access time ($t_{AA}$).

Here, the address access time ($t_{AA}$) is a performance index indicating how fast data can be output from a read command. That is, the address access time ($t_{AA}$) is a critical parameter determining performance of a semiconductor memory device.

To solve the aforesaid problems, there has been proposed a method of further delaying the command signals BWEN and YS intentionally only during a write operation because the purpose of intentionally delaying the column command signals BWEN and YS is to adjust a timing in the write operation.

Figure 3A:
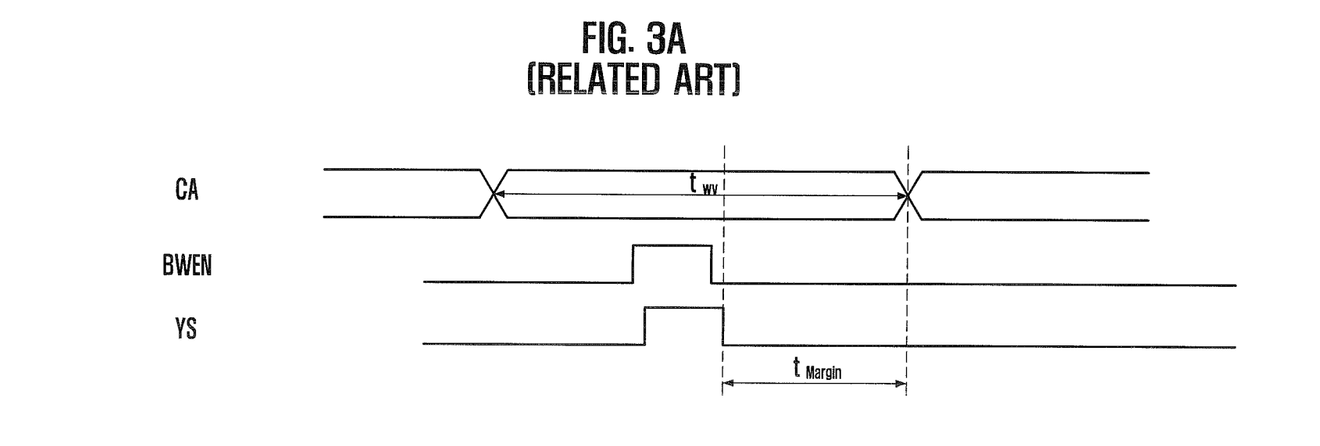
FIGS. 3A and 3B are timing diagrams illustrating a timing margin between a column select signal (YS) and a column address (CA) according to a cycle time ($t_{CK}$).
Figure 3B:
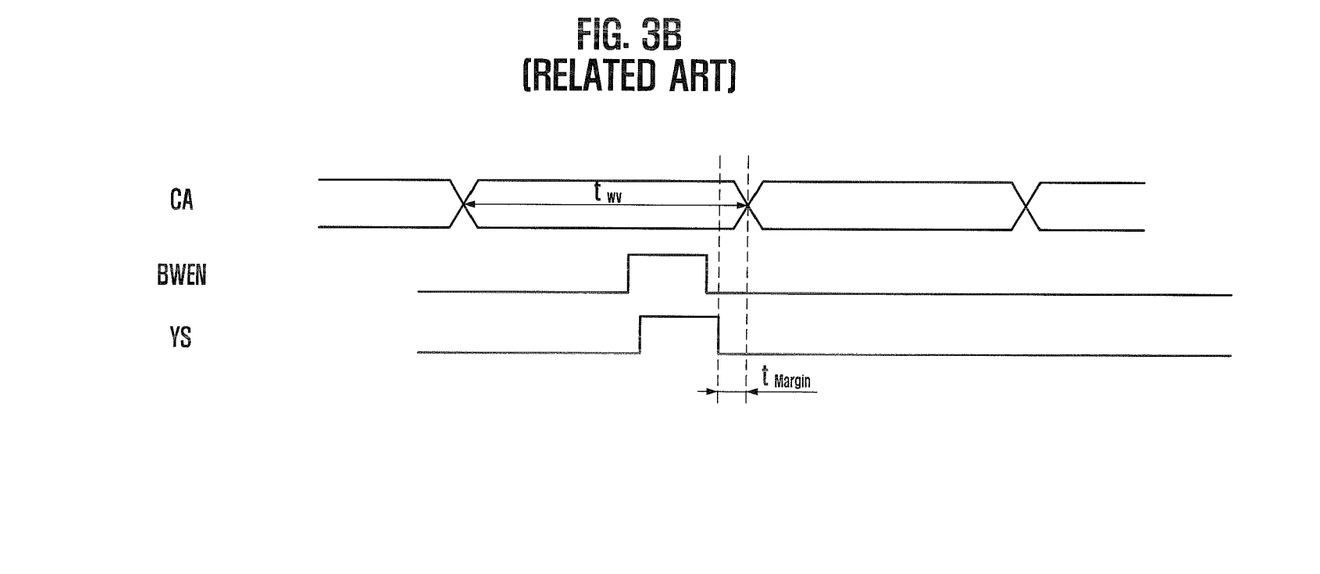

FIGS. 3A and 3B are timing diagrams illustrating a timing margin between the column select signal YS and a column address signal CA according to a cycle time ($t_{CK}$).

Specifically, FIG. 3A is a timing diagram illustrating a timing margin between the column select signal YS and the column address signal CA during a write operation under conditions of SLOW PVT and sufficient cycle time ($t_{CK}$). Even though a pulsing timing of the column select signal YS is more delayed to be adapted for a delay time of data during the write operation than a read operation, it is possible to perform the write operation well. That is, the column select signal YS can pulse within an activation period of the column address signal CA because an address window valid $t_{WV}$ (specified as $4t_{CK}$ in DDR3 standard) is sufficiently ensured.

For reference, only if the column select signal YS is activated during the activation period of the column address signal CA, a corresponding column line can be properly selected. For example, when the column address signal CA has an address value allowing the selection of a column decoder to be 3, the column line corresponding to 3 is selected if the column select signal YS is activated within that period. Likewise, when the column address signal CA has an address value allowing the selection of a column decoder to be 2, the column line corresponding to 2 is selected if the column select signal YS is activated within that period.

FIG. 3B is a timing diagram illustrating a timing margin between the column select signal YS and the column address signal CA under condition that a cycle time ($t_{CK}$) is small. In this case, the address window valid $t_{WV}$ of the column address signal CA also becomes small due to small cycle time ($t_{CK}$).

Therefore, the column select signal YS may fall out of the activation period of the column address signal CA if the column select signal YS is delayed more to be adapted for a timing of the data signal during the write operation. Further, if such a situation takes place under the SLOW PVT condition, a delay value of the column select signal YS becomes greater, which may cause the column select signal YS not to fall within the address window valid $t_{WV}$.

In summary, a timing margin between the column select signal YS and the column address signal CA decreases as the cycle time ($t_{CK}$) decreases. If the conventional semiconductor memory device employs a scheme of intentionally delaying the column select signal YS more to improve an address access time ($t_{AA}$), the column select signal YS may not be activated within the activation period of the column address signal CA.

SUMMARY OF THE INVENTION

Embodiments of the present invention are directed to providing a semiconductor memory device that can ensure a sufficient margin between a column select signal and a column address even though a delay time of the column select signal is increased to improve an address access time ($t_{AA}$) during a write operation.

In accordance with an aspect of the invention, a semiconductor memory device includes a discrimination signal generating circuit configured to generate a discrimination signal activated in a write operation of the device, and a selective delay circuit configured selectively to delay a column address in response to the discrimination signal.

DESCRIPTION OF SPECIFIC EMBODIMENTS

Hereinafter, a semiconductor memory device in accordance with the present invention will be described in detail with reference to the accompanying drawings.

Figure 4:
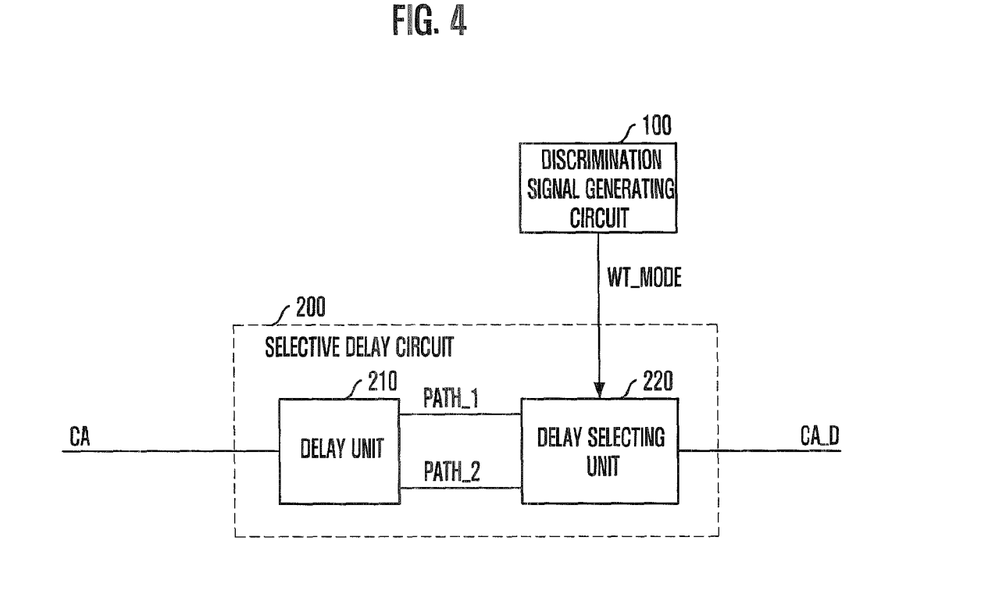
FIG. 4 is a block diagram illustrating a column address transmission line of a semiconductor memory device in accordance with the present invention.

FIG. 4 is a block diagram illustrating a column address transmission line of a semiconductor memory device in accordance with the invention.

The semiconductor memory device in accordance with the invention includes a discrimination signal generating circuit 100 and a selective delay circuit 200. The semiconductor memory device changes a delay value of a column address signal CA according to whether a current operation is a write operation or not, thereby increasing a timing margin between the column address signal CA and a column select signal YS.

The discrimination signal generating circuit 100 generates a discrimination signal WT_MODE indicating that the semiconductor memory device performs a write operation. In the semiconductor memory device of the invention, a delay value of the column address signal CA in the write operation differs from a delay value of the column address signal CA in a read operation. To this end, the discrimination signal generating circuit 100 generates the discrimination signal WT_MODE indicating that the semiconductor memory device performs the write operation, thereby increasing the delay value of the column address signal CA during the write operation.

The selective delay circuit 200 selectively delays the column address signal CA according to the discrimination signal WT_MODE output from the discrimination signal generating circuit 100 to produce a delayed column address output CA_D. In more detail, when the semiconductor memory device performs a write operation and the discrimination signal WT_MODE is activated, the delay value of the column address signal CA is increased. On the contrary, when the discrimination signal WT_MODE is deactivated, the delay value of the column address signal CA is decreased.

The selective delay circuit 200 includes a delay unit 210 and a delay selecting unit 220. The delay unit 210 is configured to delay the column address signal CA by delay times different from each other. The delay selecting unit 220 is configured to select a column address passing through the delay unit 210 in response to the discrimination signal WT_MODE.

The selective delay circuit 200 delays the column address signal CA by the different delay times according to whether a current operation is a write operation or not. Hence, the selective delay circuit 200 may be provided in a number equal to the column address signal CA. For example, if ten column addresses CA0 to CA9 are used, ten selective delay circuits may be provided to delay the column addresses CA0 to CA9, respectively.

Figure 5:
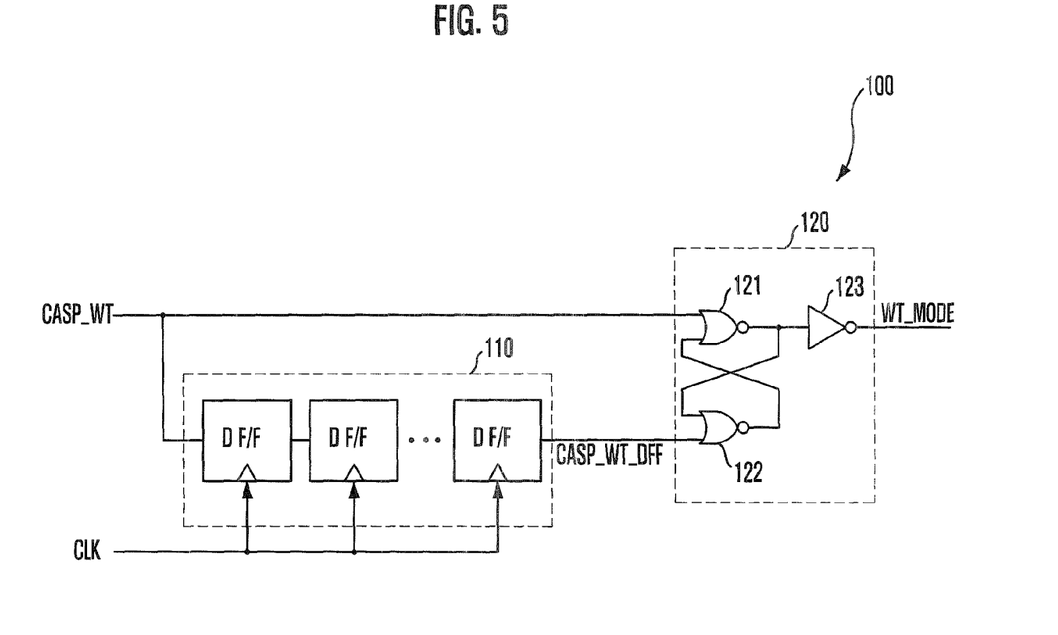
FIG. 5 is a block diagram of a discrimination signal generating circuit in FIG. 4.

FIG. 5 is a block diagram of the discrimination signal generating circuit 100 in FIG. 4.

The discrimination signal generating circuit 100 generates the discrimination signal WT_MODE indicating that the semiconductor memory device performs a write operation. The discrimination signal WT_MODE may be generated by a combination of a variety of signals relevant to the write operation. In FIG. 5, it is exemplarily illustrated that the discrimination signal WT_MODE is generated using an internal write command signal CASP_WT.

The internal write command signal CASP_WT is a pulse signal generated by combining a write enable signal WE and a column address strobe (CAS) command corresponding to a write command, and is activated when the semiconductor memory device performs a write operation.

If the internal write command signal CASP_WT is activated once, the discrimination signal WT_MODE is activated for a predetermined set time and then deactivated. Herein, the predetermined set time is a time required for the semiconductor memory device to perform a write operation. Since the internal write command signal CASP_WT is a pulsed signal of which an activation period is short, it is difficult to sufficiently ensure a time required for the write operation of the semiconductor memory device. Therefore, the discrimination signal WT_MODE is controlled such that it is activated simultaneously with the internal write command signal CASP_WT but deactivated after a sufficient time. Here, the activation period of the discrimination signal WT_MODE is very important because the delay value of the column address signal CA is increased during the activation period of the discrimination signal WT_MODE.

The discrimination signal generating circuit 100 includes a delay unit 110 and an SR latch. The delay unit 110 is configured to delay the internal write command signal CASP_WT to output a delayed internal write command signal CASP_WT_DFF. The SR latch 120 is configured to receive the internal write command signal CASP_WT and the delayed internal write command signal CASP_WT_DFF to output the discrimination signal WT_MODE.

The delay unit 110 includes one or more D flip-flops connected in series. As the number of the D flip-flops increases, the delay value increases.

The SR latch 120 includes a first NOR gate 121, a second NOR gate 122, and an inverter 123. The first NOR gate 121 is configured to receive the internal write command signal CASP_WT and the second NOR gate 122 is configured to receive the delayed internal write command signal CASP_WT_DFF The inverter 123 is configured to invert an output signal of the first NOR gate 121 to output the discrimination signal WT_MODE. Herein, the first and second NOR gates 121 and 122 are cross-coupled to each other to form a latch.

Figure 6:
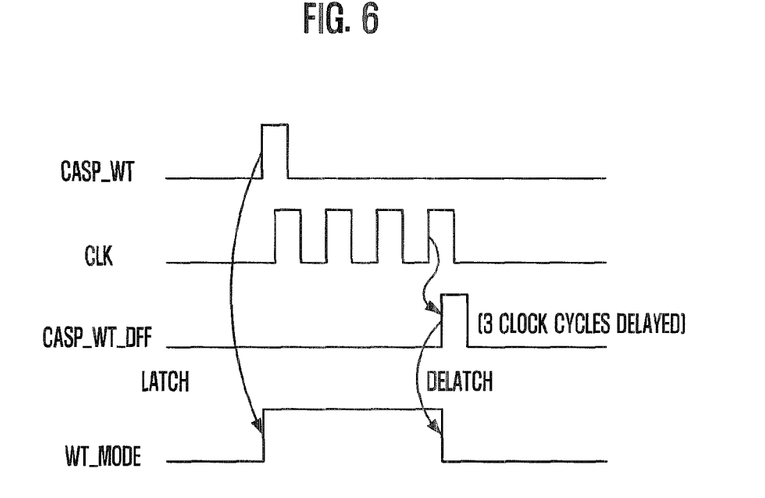
FIG. 6 is a timing diagram illustrating an operation of the discrimination signal generating circuit in FIG. 5.

FIG. 6 is a timing diagram illustrating an operation of the discrimination signal generating circuit 100 in FIG. 5.

The discrimination signal WT_MODE is activated when the internal write command signal CASP_WT is activated, and the discrimination signal WT_MODE is then deactivated according to the delayed internal write command signal CASP_WT_DFF after three cycles of the clock CLK.

Although FIG. 6 exemplarily illustrates that the discrimination signal WT_MODE is activated for three clock cycles, it is possible to differently set the activation period of the discrimination signal WT_MODE depending on a time for the write operation and an operating speed of the semiconductor memory device.

Alternatively, the discrimination signal generating circuit 100 of the invention may employ an inverter delay as the delay unit 110 instead of the D flip-flop, and also employ a NAND gate as the SR latch 120 instead of the NOR gate. It will be apparent to those skilled in the art that various employments could be employed without departing from the scope of the invention.

Figure 7:
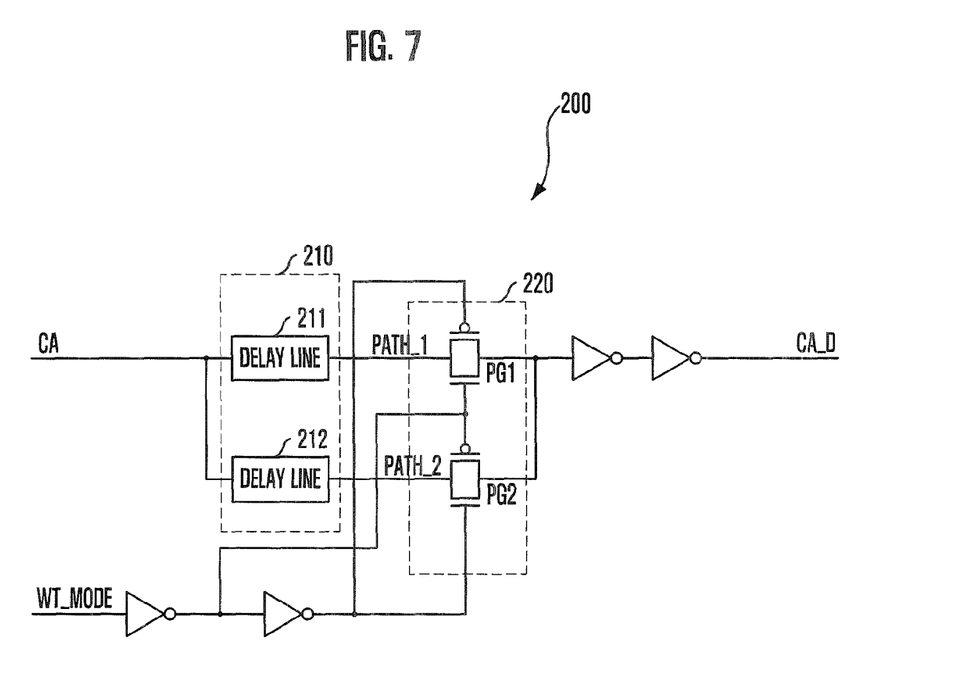
FIG. 7 is a block diagram of a selective delay circuit in FIG. 4 in accordance with an embodiment of the invention.

FIG. 7 is a block diagram of the selective delay circuit 200 in FIG. 4 in accordance with one embodiment of the invention.

The selective delay circuit 200 includes the delay unit 210 configured to delay the column address signal CA by delay times different from each other, and the delay selecting unit 220 configured to be responsive to the discrimination signal WT_MODE to select one of column addresses, which is delayed by the delay unit 210 and then transferred through first and second path PATH_1 and PATH_2.

The delay units 210 may be configured with two delay lines 211 and 212 which delay the column address signal CA by the different delay times. Since the invention is characterized in that the delay value of the column address signal CA of the semiconductor memory device is increased during the write operation, the delay line for the column address signal CA of the write operation, e.g., a first delay line 212, has a delay value greater than the other, e.g., a second delay line 211.

The second delay line 211 may be set to have the delay value of '0' because a difference in delay values is more important than respective delay values of the first and second delay lines 211 and 212. Accordingly, the second delay line 211 can be embodied by such a metal line.

The delay selecting unit 220 may be configured with two pass gates PG1 and PG2 that receive output signals of the first and second delay lines 211 and 212, respectively. The first and second pass gates PG1 and PG2 are turned on/off in response to the discrimination signal WT_MODE. When the semiconductor memory device performs a write operation, that is, when the discrimination signal WT_MODE is activated, the pass gate PG2 is turned on to output a column address, which has a relatively increased delay value, transferred through the second path PATH_2. Otherwise, the discrimination signal WT_MODE is deactivated so that the pass gate PG1 is turned on to output a column address, which has a relatively decreased delay value, transferred through the first path PATH_1.

A delayed column address signal CA_D output from the selective delay circuit 200 is transferred to each bank. A circuit may be designed to receive the delayed column address signal CA_D at only a bank to use the delayed column address signal CA_D, that is, at a bank to be operated currently. This circuit is not related to the technical idea of the invention, and thus not shown herein.

The selective delay circuit 200 may further include inverters to process input and output signals, i.e., the discrimination signal WT_MODE and the delayed column address signal CA_D. It could be also designed for the inverters to be included in the delay selecting unit 220 and, however, the descriptions in detail will be omitted herein.

Figure 8:
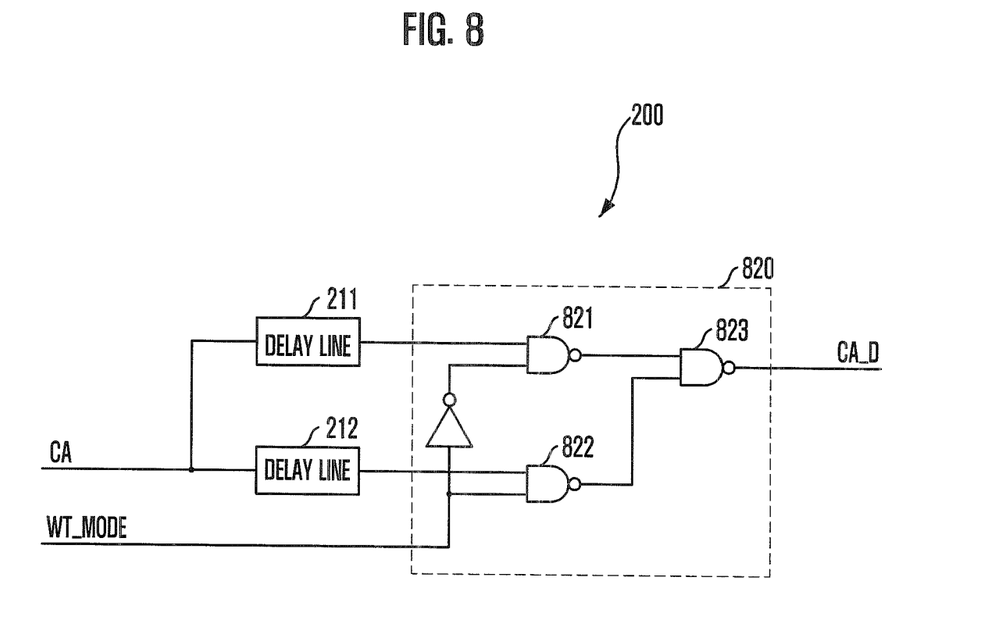
FIG. 8 is a block diagram of a selective delay circuit in FIG. 4 in accordance with another embodiment of the invention.

FIG. 8 is a block diagram of the selective delay circuit 200 in FIG. 4 in accordance with another embodiment of the invention.

Differently from the delay selecting unit 220 of FIG. 7, a delay selecting unit 820 of the selective delay circuit 200 in accordance with this embodiment is configured with NAND gates 821, 822 and 823 in stead of the pass gates PG1 and PG2. The delay selecting unit 820 further includes an inverter for inverting the discrimination signal WT_MODE.

Referring to FIG. 8, a first NAND gate 821 is configured to perform a NAND operation on an inverted discrimination signal WT_MODEB and one of output signals of the delay lines 211 and 212. A second NAND gate 822 is configured to perform a NAND operation on the discrimination signal WT_MODE and another one of the output signals of the delay lines 211 and 212. A third NAND gate 823 is configured to perform a NAND operation on output signals of the first and second NAND gates 821 and 822.

The selective delay circuit 200 of FIG. 8 differs in a configuration of the delay selecting unit 820 from the selective delay circuit 200 of FIG. 7, but they operate in the same manner. Therefore, further description for operation will be omitted herein.

The semiconductor memory device in accordance with the invention increases a delay time of the column address signal CA during a write operation. Therefore, the delay time of the column address signal CA is equally increased even when a delay time of the column select signal YS is increased to improve an address access time ($t_{AA}$) during a write operation. Accordingly, a sufficient margin between the column address signal CA and the column select signal YS can be ensured. That is, it is possible to ensure a sufficient margin between a column select signal and a column address in spite of using a scheme of intentionally increasing a delay time of the column select signal to improve an address access time ($t_{AA}$) during a write operation.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a discrimination signal generating circuit configured to generate a discrimination signal activated in a write operation of the device;
   a delay unit having two delay lines to respectively delay a signal representing a column address for first and second delay times that are different from each other; and
   a delay selecting unit configured to receive the discrimination signal, output an output of a first delay line of the delay lines in response to a receipt by the delay selecting unit of the discrimination signal having a first state, and output an output of a second delay line of the delay lines in response to a receipt by the delay selecting unit of the discrimination signal having a second state.

2. The semiconductor memory device as recited in claim 1, wherein one of the delay lines has a delay value of 0.

3. The semiconductor memory device as recited in claim 1 wherein the delay selecting unit includes two pass gates configured to receive output signals of the delay lines, respectively.

4. The semiconductor memory device as recited in claim 3, wherein the pass gates are turned on/off in response to the discrimination signal.

5. The semiconductor memory device as recited in claim 1, wherein the delay selecting unit includes:
   a first NAND gate configured to perform a NAND operation on an inverted discrimination signal and an output signal of the delay lines;
   a second NAND gate configured to perform a NAND operation on the discrimination signal and another output signal of the delay lines; and
   a third NAND gate configured to perform a NAND operation on output signals of the first and second NAND gates.

6. The semiconductor memory device as recited in claim 1, wherein the discrimination signal generating circuit generates the discrimination signal in response to an internal write command signal.

7. The semiconductor memory device as recited in claim 6, wherein the discrimination signal is activated for a predetermined set time when the internal write command signal is activated once.

8. The semiconductor memory device as recited in claim 7, wherein the predetermined set time is a time required for the write operation of the device.

9. The semiconductor memory device as recited in claim 6, wherein the discrimination signal generating circuit includes:
   a delay unit configured to delay the internal write command signal; and
   an SR latch configured to receive the internal write command signal and an output signal of the delay unit to output the discrimination signal.

10. The semiconductor memory device as recited in claim 1, wherein a delay time of the column address signal is greater in the write operation than in a read operation.

11. The semiconductor memory device as recited in claim 1, wherein the selective delay circuit delays the column address signal in the write operation more than in a read operation.

12. The semiconductor memory device as recited in claim 1, wherein a plurality of said selective delay circuits are provided and are equal in number to a number of said column address signals.

* * * * *